(12) United States Patent
Horikoshi et al.

(10) Patent No.: US 6,979,645 B2
(45) Date of Patent: Dec. 27, 2005

(54) METHOD OF PRODUCING A SEMICONDUCTOR DEVICE HAVING COPPER WIRING

(75) Inventors: Hiroshi Horikoshi, Kanagawa (JP); Yuji Segawa, Tokyo (JP); Takeshi Nogami, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/680,668

(22) Filed: Oct. 7, 2003

(65) Prior Publication Data

US 2005/0003654 A1      Jan. 6, 2005

(30) Foreign Application Priority Data

Oct. 11, 2002   (JP) .............................. 2002-299417

(51) Int. Cl.[7] ............................................ H01L 21/44
(52) U.S. Cl. ........................ 438/678; 438/653; 438/687
(58) Field of Search ................................ 438/597, 652, 438/653, 678, 686, 687

(56) References Cited

U.S. PATENT DOCUMENTS

| | | | |
|---|---|---|---|
| 6,479,384 B2 * | 11/2002 | Komai et al. ................ | 438/687 |
| 6,809,029 B2 * | 10/2004 | Nogami et al. ............. | 438/638 |
| 2004/0096592 A1 * | 5/2004 | Chebiam et al. .......... | 427/443.1 |
| 2004/0175509 A1 * | 9/2004 | Kolics et al. ............. | 427/443.1 |

* cited by examiner

Primary Examiner—Brad Smith
(74) Attorney, Agent, or Firm—Sonnenschein, Nath & Rosenthal LLP

(57) ABSTRACT

A method of producing a semiconductor device capable of suppressing damages by corrosion on wiring in a catalyst process performed in electroless plating processing on a Co base material, etc. in producing a semiconductor device having wiring of Cu, etc., having steps of forming metal wiring including an additive on a first insulation film formed in a semiconductor substrate, and forming on the metal wiring a barrier layer for preventing diffusion of constituting elements of the metal wiring, wherein said additive is an element to reduce corrosion of the metal wiring at the time of forming the barrier layer in the step of forming the metal wiring.

7 Claims, 10 Drawing Sheets

METHOD OF PRODUCING A SEMICONDUCTOR DEVICE HAVING COPPER WIRING

RELATED APPLICATION DATA

The present application claims priority to Japanese Application(s) No(s). P2002-299417 filed Oct. 11, 2002, which application(s) is/are incorporated herein by reference to the extent permitted by law.

BACKGROUND OF THE INVENTION

1. Field of the Invention

The present invention relates to a method of producing a semiconductor device, and particularly relates to a method of producing a semiconductor device having copper (Cu) wiring.

2. Description of the Related Art

Along with a reduction in design rules, a reduction of a wiring capacitance in reduced wiring has been required in an LSI and other semiconductor devices. Thus, copper (Cu) is broadly applied as a wiring material. It is known that when applying Cu wiring, in addition to a reduction of a wiring capacitance, reliability of wiring is also improved.

A semiconductor device wherein buried metal wiring is configured by using the above Cu and a production method thereof will be explained.

FIG. 1 is a sectional view of a semiconductor device wherein buried metal wiring is configured by using Cu.

An interlayer insulation film 101 made by an insulation material, such as a silicon oxide, is formed by covering over a semiconductor substrate 100 formed with a not shown transistor or other semiconductor element, and wiring grooves (101a and 101b) are formed on the interlayer insulation film 101 by a single damascene method or a dual damascene method. In the case of the dual damascene method, it is configured that a contact hole reaching to the semiconductor substrate 100, etc. is provided at the bottom of the wiring groove.

A barrier layer 102 made, for example, by Ta, TaN, TiN, W, WN, etc. is formed so as to cover inner walls of the wiring grooves (101a and 101b), and buried metal wiring (103a and 103b) made by Cu is formed inside thereof so as to bury the wiring grooves (101a and 101b).

A barrier insulation film 104 made by silicon nitride is formed by covering allover the buried metal wiring (103a and 103b) buried in the wiring grooves (101a and 101b), and an upper layer insulation film 105 made by an insulation material, such as a silicon oxide, is formed thereon.

Next, a method of producing a semiconductor device wherein a buried metal wiring is configured by using Cu as above will be explained.

First, as shown in FIG. 2A, an interlayer insulation film 101 is formed by depositing an insulation material, such as a silicon oxide, for example by the Chemical Vapor Deposition (CVD) method so as to cover the semiconductor substrate 100 formed with a not shown transistor or other semiconductor element, and wiring grooves (101a and 101b) are formed on the interlayer insulation film 101 by photolithography processing and etching processing such as Reactive Ion Etching (RIE).

Next, as shown in FIG. 2B, a barrier layer 102 is formed by depositing Ta, TaN, TiN, W, WN, etc. for example by a sputtering method or a CVD method.

Next, successively from the formation of the above barrier layer 102, without exposing in the air, a Cu seed layer is formed by covering allover the barrier layer 102.

Next, the Cu seed layer is grown by electrolytic plating processing so as to form a Cu buried conductive layer 103.

Next, as shown in FIG. 3A, the buried conductive layer 103 is polished from an upper surface, for example, by a Chemical Mechanical Polishing (CMP) method, electrolytic polishing processing or other processing and Cu being outside of the wiring grooves (101a and 101b) is removed so as to obtain buried metal wiring (103a and 103b) buried in the wiring grooves (101a and 101b). At this time, portions of the barrier layer 102 being outside of the wiring grooves (101a and 101b) are also removed.

Next, as shown in FIG. 3B, silicon nitride is deposited, for example, by a sputtering method or a CVD method to form a barrier insulation film 104.

Next, on the barrier insulation film 104, a silicon oxide or other insulation material is deposited, for example, by a CVD method to form an upper layer insulation film 105.

From the above processing, a semiconductor device wherein buried metal wiring is configured by using Cu shown in FIG. 1 can be produced.

In the Cu wiring configured as above, there are disadvantages such that (1) a barrier insulation film of SiN, SiC, etc. having a high dielectric constant is required to suppress diffusion of Cu in a silicon oxide insulation film, and a wiring capacitance is increased due to the barrier insulation film material having a high dielectric constant, and (2) a boundary face between the Cu wiring and the barrier insulation film has low electromigration (EM) resistance.

To prevent the above disadvantages, there is an approach of applying a Cu diffusion prevention material to only on the Cu wiring. Because wiring is a metal material, a method of using a metal material as its cap is widely used.

For example, there is a method of forming a recess of several tens of nm or so at an upper portion of the Cu wiring, forming a film of a barrier metal material of TiN, TiW, etc. allover thereon and leaving a barrier metal film formed on the wiring portion by a CMP method and a method of forming a film selectively on the Cu by a CVD method of W. etc.

Also, a method of forming a film of a Co base material on the Cu wiring by electroless plating may be mentioned as one method. This technique brings advantages of enabling film formation with a simple apparatus, not requiring a plurality of different processes and requiring inexpensive process costs including material costs when compared with the above two techniques.

On the other hand, there are challenges left, such as a difficulty of selective growing on Cu and damages by corrosion on Cu due to a catalyst process included in the electroless plating processing of a Co base material, etc.

Among them, selective growing on Cu has been almost solved by a method of performing light etching on a field by HF, etc. on a base subjected to electroless plating (for example, refer to the article (The 61st Semiconductor Integrated Circuit Symposium Lectures (pp.13 to 18), 2001)).

However, on the other hand, damages by corrosion on Cu in the catalyst process have not been solved yet as described below.

In electroless plating using a catalyst process, palladium (Pd) is widely used as a catalyst substance. The catalyst process is substitutional plating for substituting Pd for Cu as a base, and it is inevitable to etch a part of the Cu as a base.

FIG. 4 is a schematic view for explaining a disadvantage in the above catalyst process (substitutional plating).

The Cu as a base is made by crystal grains and the boundaries are called crystal boundaries 103c. In the catalyst process (substitutional plating), corrosion on the weakly bonded crystal boundaries 103c is notable compared with that on Cu crystal, and not only a surface of the Cu but even inside thereof is sometimes corroded in extreme cases. Due to the corrosion, a corrosion hole is formed on the Cu forming the wiring, namely, a void is formed in the wiring so as to decrease an effective sectional area of the wiring and to remarkably deteriorate reliability of electromigration (EM), etc.

Furthermore, palladium sulfate and palladium chloride, etc. are widely used as a Pd source, and solutions of these have a pH on the strongly acidic side and are in a range where Cu is easily ionized, so that they act as a factor of accelerating the corrosion.

SUMMARY OF THE IMVENTION

An object of the present invention is to provide a method of producing a semiconductor device having wiring of Cu, etc. and to provide a method of producing a semiconductor device capable of suppressing damages by corrosion on wiring in a catalyst process performed in electroless plating processing of a Co base material, etc.

To attain the above object, a method of producing a semiconductor device of the present invention is a method of producing a semiconductor device having metal wiring, having steps of forming metal wiring containing an additive on a first insulation film formed in a semiconductor substrate, forming on the metal wiring a barrier layer for preventing diffusion of constituting elements of the metal wiring, and forming a second insulation film on the barrier layer, wherein the additive is an element to reduce corrosion of the metal wiring at the time of forming the barrier layer.

The method of producing a semiconductor device of the above present invention is a method for producing a semiconductor device having metal wiring, wherein metal wiring containing an additive is formed on a first insulation film formed in a semiconductor substrate, a barrier layer to prevent diffusion of constituting elements of the metal wiring is formed on the metal wiring, and a second insulation film is formed on the barrier layer.

Here, the additive to be contained in the metal wiring is an element to reduce corrosion of the metal wiring at the time of forming the barrier layer.

DESCRIPTION OF THE PREFERRED EMBODIMENT

Below, embodiments of the present invention will be explained with reference to the drawings.

To give damages by corrosion on Cu wiring in a semiconductor device lead to give damages on wiring reliability of the semiconductor device, which is a fatal defect. A method of producing a semiconductor device according to the present embodiment provides a method of reducing the damages on the Cu wiring.

Figure 1:
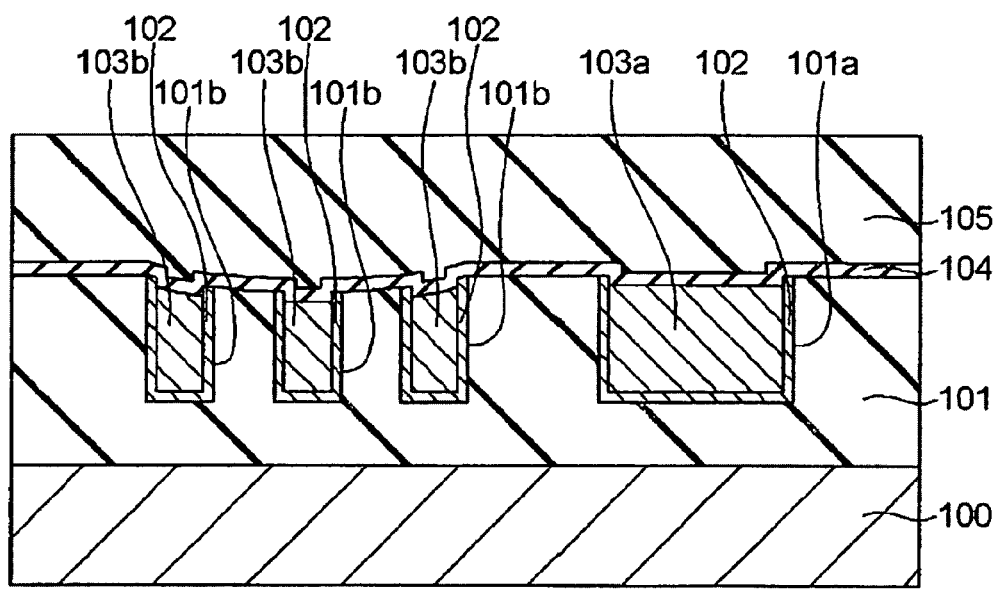
FIG. 1 is a sectional view of a semiconductor device according to the related art.
Figure 2A:
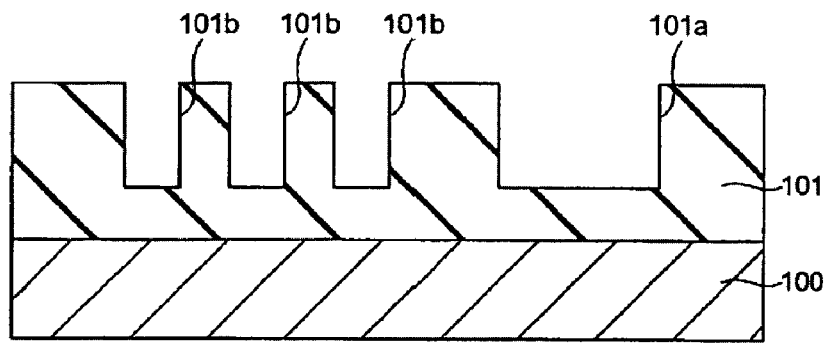
FIG. 2A and FIG. 2B are sectional views of production processes of a method of producing the semiconductor device according to the related art.
Figure 2B:
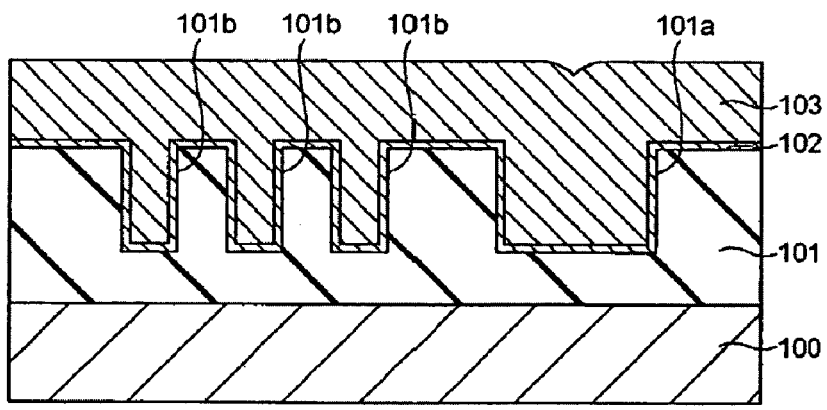
Figure 3A:
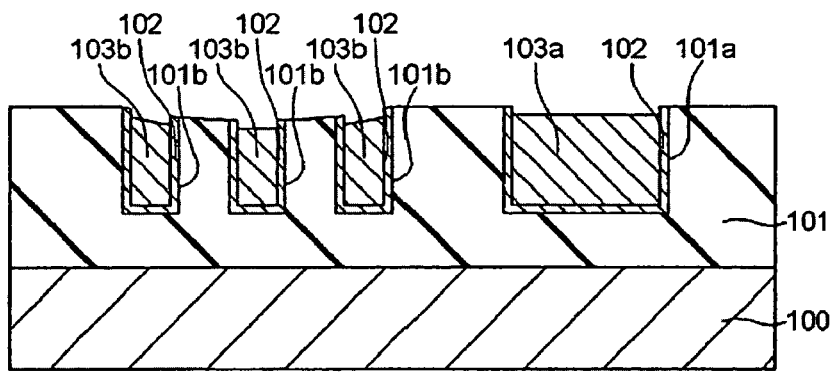
FIG. 3A and FIG. 3B are sectional views of production processes of the method of producing the semiconductor device according to the related art.
Figure 3B:
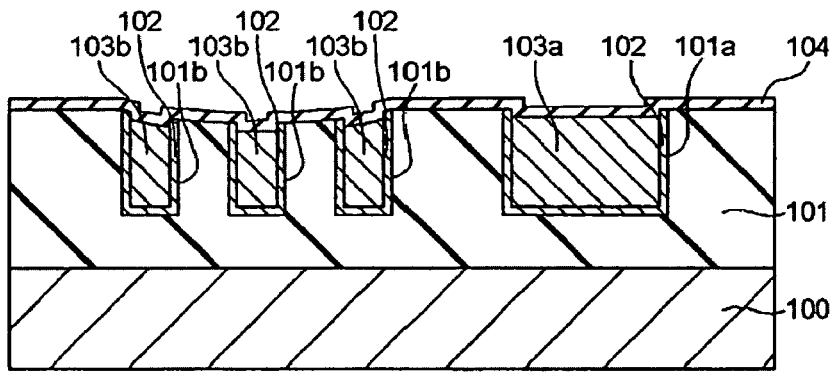
Figure 4:
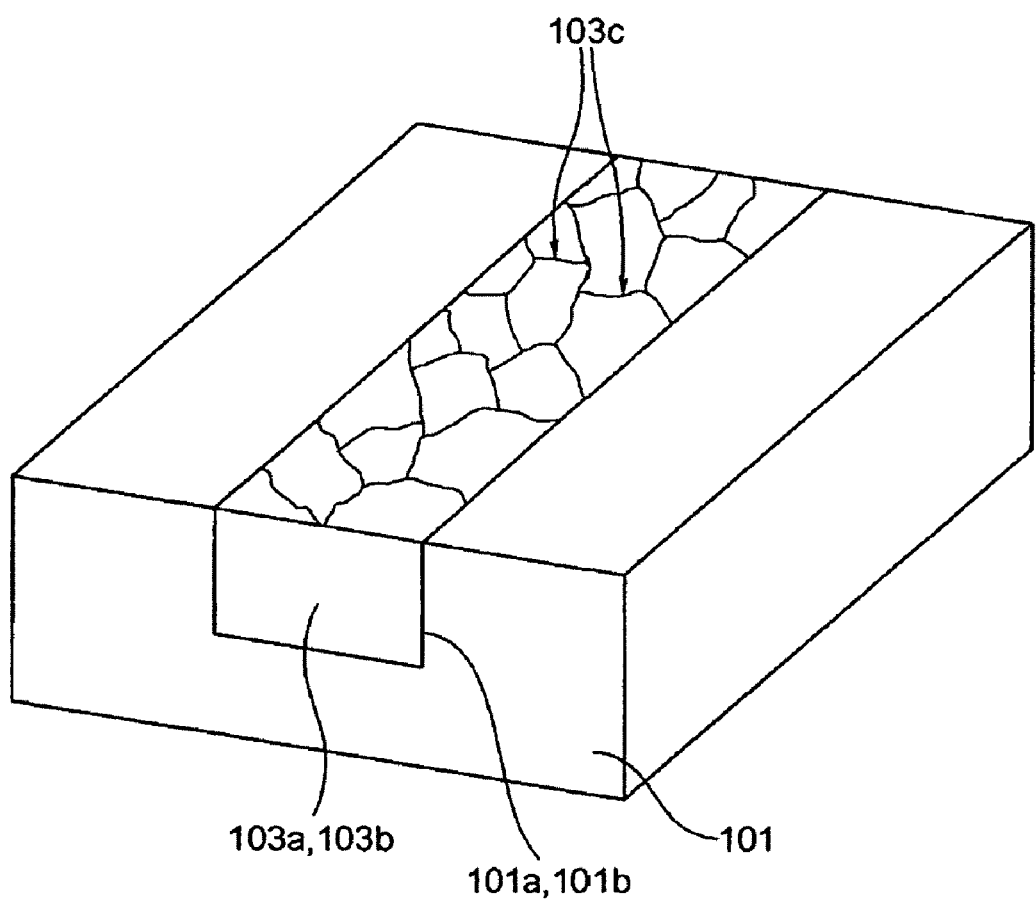
FIG. 4 is a schematic view for explaining a disadvantage in a catalyst process (substitutional plating) of the related art.
Figure 5:
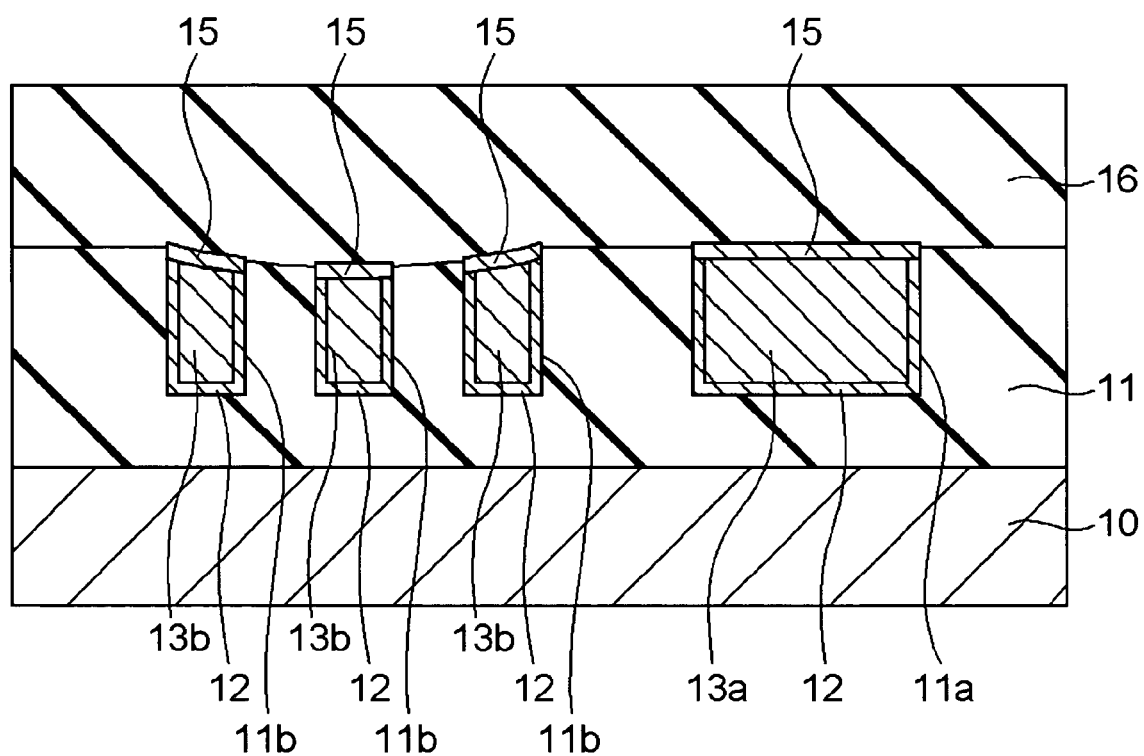
FIG. 5 is a cross-sectional view of a semiconductor device according to an embodiment of the present invention.

FIG. 5 is a sectional view of a semiconductor device wherein buried metal wiring is configured by using Cu according to the present embodiment.

An interlayer insulation film 11 made by an insulation material, such as a silicon oxide, is formed by covering over a semiconductor substrate 10 formed with a not shown transistor or other semiconductor device, and wiring grooves (11a and 11b) are formed on the interlayer insulation film 11 by a single damascene method or a dual damascene method. In the case of the dual damascene method, it is configured that a contact hole reaching to the semiconductor substrate 10, etc. is provided at the bottom of the wiring groove.

A first barrier layer 12 made, for example, by Ta, TaN, TiN, W, WN, etc. is formed so as to cover inner walls of the wiring grooves (11a and 11b), and buried metal wiring (13a and 13b) made by Cu is formed inside thereof so as to bury the wiring grooves (11a and 11b).

A second barrier layer 15 made by a Co base material, such as Co-W-P, is formed on the buried metal wiring (13a and 13b) buried in the wiring grooves (11a and 11b), and an upper layer insulation film 16 made by an insulation material, such as a silicon oxide, is formed thereon.

Here, the above buried metal wiring (13a and 13b) is characterized by containing as an additive an element to reduce damages by corrosion on the buried metal wiring in the process of forming the second barrier layer 15. In the case of performing catalyst plating of Pd in the process of forming the second barrier layer 15, iridium (Ir), platinum (Pt), gold (Au) or other element having a less ionization tendency compared with Pd is contained as the additive.

Therefore, damages by corrosion on the metal wiring are reduced at the time of forming the barrier layer in the production process.

Next, a method of producing a semiconductor device wherein buried metal wiring is configured by using Cu according to the above present embodiment will be explained.

FIG. 6A to FIG. 10B are sectional views of production processes of a method of producing the above semiconductor device.

Figure 6A:
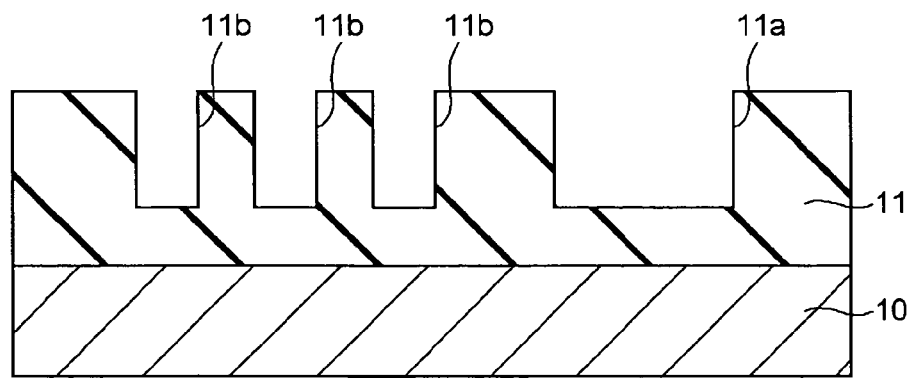
FIG. 6A and FIG. 6B are sectional views of production processes of a method of producing the semiconductor device according to the embodiment of the present invention.

First, as shown in FIG. 6A, an interlayer insulation film 11 is formed by depositing an insulation material, such as a silicon oxide, for example by a CVD method so as to cover the semiconductor substrate 10 formed with a not shown transistor or other semiconductor element, and wiring grooves (11a and 11b) are formed on the interlayer insulation film 11 by photolithography processing and etching processing such as Reactive Ion Etching (RIE).

Figure 6B:
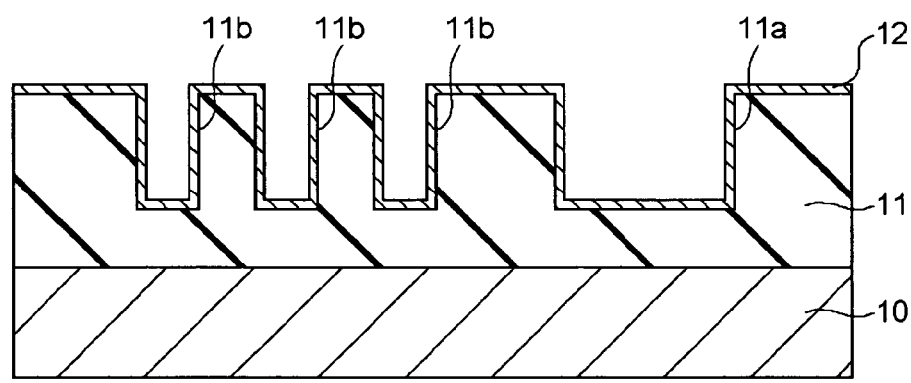

Next, as shown in FIG. 6B, a first barrier layer 12 is formed by depositing Ta, TaN, TiN, W, WN, etc. for example by a sputtering method or a CVD method.

Figure 7A:
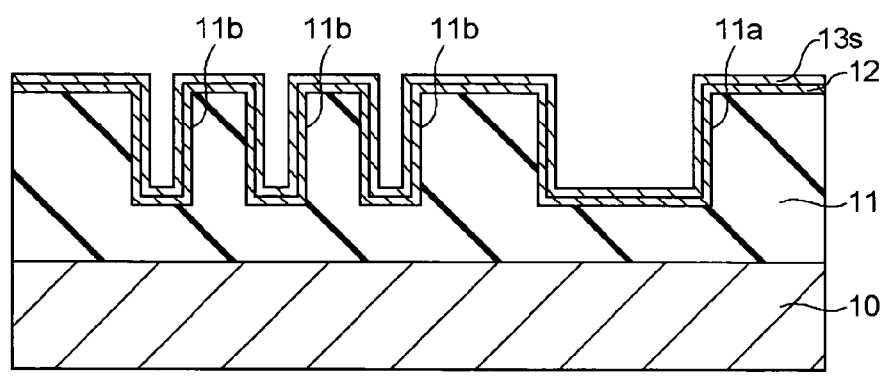
FIG. 7A and FIG. 7B are sectional views of the production processes of the method of producing the semiconductor device according to the embodiment of the present invention.

Next, as shown in FIG. 7A, a Cu seed layer 13s is formed by covering allover the first barrier layer 12, for example, by a sputtering method or a CVD method. This process is performed successively from the formation of the above first barrier layer 12 without exposing in the air.

Figure 7B:
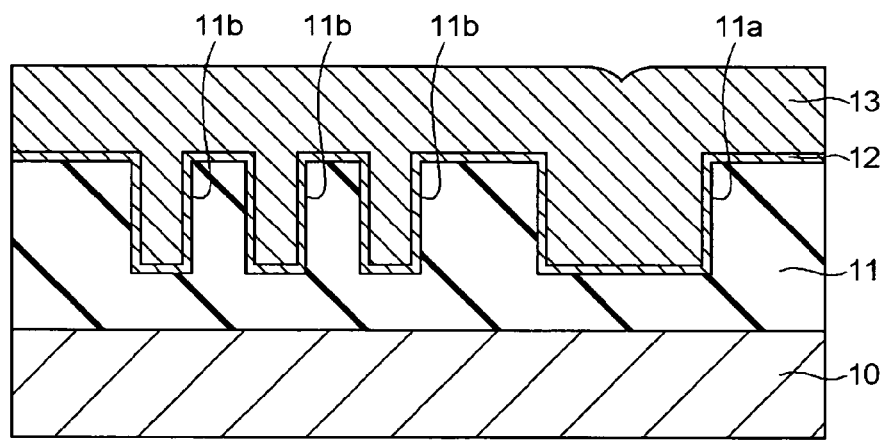

Next, as shown in FIG. 7B, the Cu seed layer 13s is grown, for example, by electrolytic plating processing so as to form a Cu buried conductive layer 13 integrally with the Cu seed layer 13s.

Here, the Cu buried conductive layer 13 is formed by containing an additive to reduce damages by corrosion on the buried metal wiring (13a and 13b) formed from the Cu buried conductive layer 13 in a following process of forming a second barrier layer 15.

In the case of performing catalyst plating of Pd in the process of forming the second barrier layer 15 as will be explained later on, elements having a less ionization tendency compared with Pd may be used as the additive and, for example, Ir, Pt, Au, etc. may be mentioned.

Figure 8A:
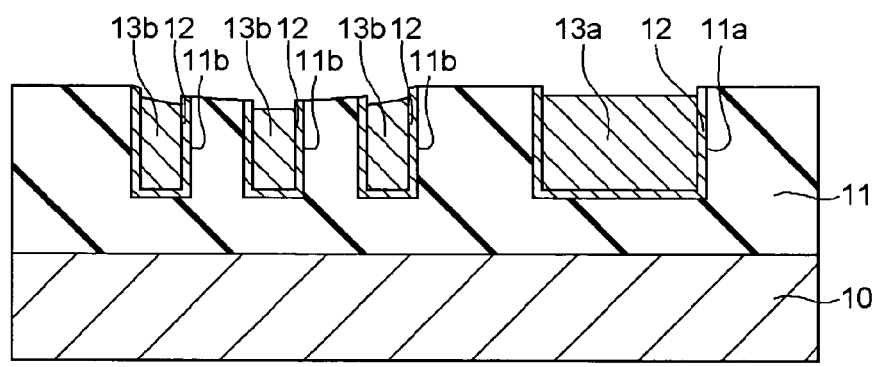
FIG. 8A and FIG. 8B are sectional views of the production processes of the method of producing the semiconductor device according to the embodiment of the present invention.

Next, as shown in FIG. 8A, the buried conductive layer 13 is polished from the upper surface, for example, by a CMP method, electrolytic polishing processing or other processing and Cu being outside of the wiring grooves (11a and 11b) is removed so as to obtain buried metal wiring (13a and 13b) buried in the wiring grooves (11a and 11b). At this time, portions of the first barrier layer 12 being outside of the wiring grooves (11a and 11b) are also removed.

Next, a second barrier layer 15 to prevent diffusion of constituting elements of the buried metal wiring (13a and 13b) made by a Co base material, such as Co-W-P, is formed on the buried metal wiring (13a and 13b) by electroless plating processing.

This process includes a plurality of processes shown in FIG. 8B to FIG. 10B, which will be respectively explained below with reference to the drawings.

Figure 8B:
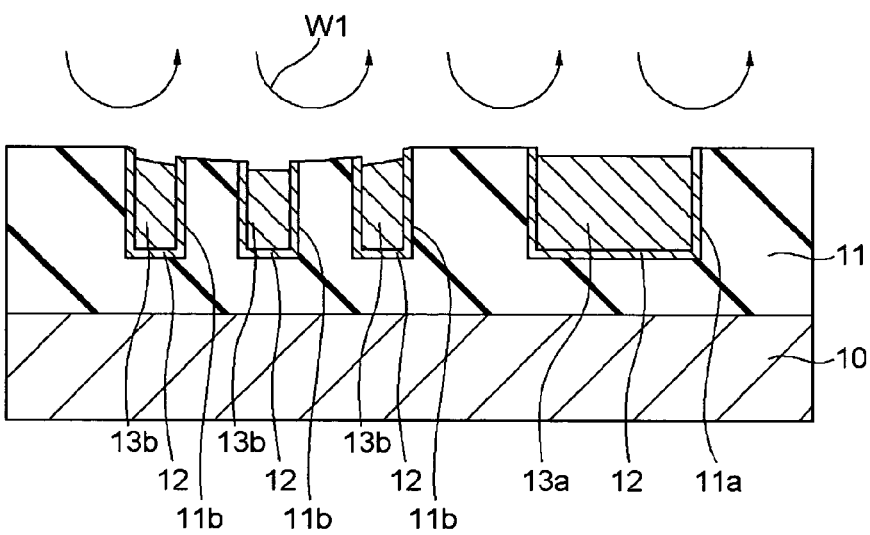

Since a wafer is tainted by a polishing agent at the time the buried metal wiring (13a and 13b) is formed by a CMP method or electrolytic polishing processing, as shown in FIG. 8B, first washing W1 for washing the front surface and back surface of the wafer is performed to remove the taint.

The first washing W1 is a key point to obtain selectivity of second barrier layer formation in a later process and an object thereof is to suppress a metal on the field to be less than a detectable limit ($1 \times 10^9$ atom/cm$^2$ or less) by an impurity measurement apparatus.

Furthermore, in the first washing W1, removal of impurities on the buried metal wiring (13a and 13b) is also performed at the same time.

As a representative example of a chemical solution used in this process, HF, a chelating agent, etc. may be mentioned. It is also effective to use brush washing and ultrasonic wave washing at the same time to improve removing performance.

Also, a process for removing a Cu protective film (for example, when polishing with a polishing agent containing benzotriazole (BTA), etc., a compound of Cu and BTA is formed, which cannot be removed with a standard washing solution due to very firm bonding) formed on the surface of the buried metal wiring (13a and 13b) made by Cu which is hard to be removed by a chemical solution is added in some cases.

Examples of a method of removing the Cu protective film will be explained below. They are basically methods of removing physically. One is a method of sputtering by ion irradiation wherein Ar, Ne, Kr or other inert gas is changed into plasma and etching of 5 nm or less is performed on the wafer surface. The other is a cathode electrolytic method wherein the wafer side is set as a cathode in an electrolytic solution and a voltage is applied thereto. The mechanism is that hydrogen (H) is generated on the cathode side (wafer side) due to electrolysis of the electrolytic solution, and the Cu protective film is liftoff due to desorption of the hydrogen.

These processes of removing a Cu protective film may be applied independently as washing after a CMP method or the electrolytic washing, however, the most preferable method is, after performing washing after the CMP method or electrolytic polishing, removing the Cu protective film, and after that, performing washing with a chemical solution again.

Figure 9A:
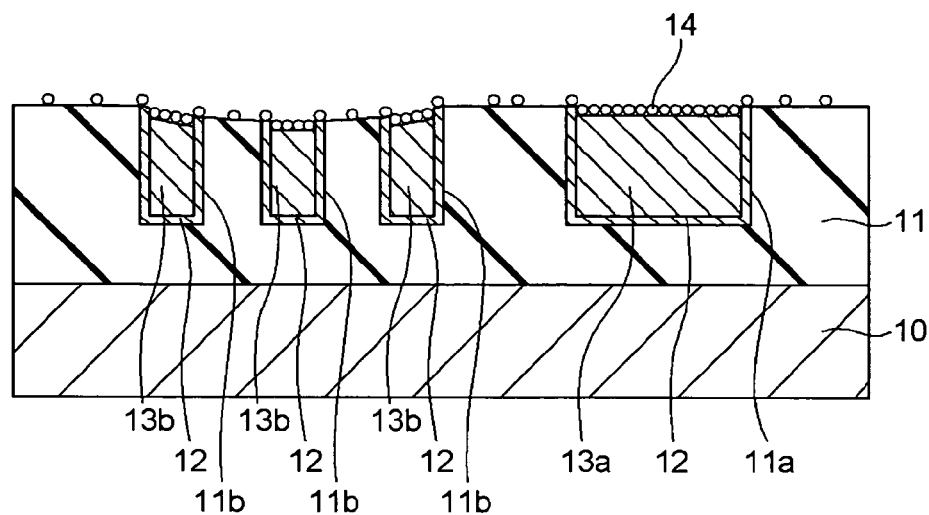
FIG. 9A and FIG. 9B are sectional views of the production processes of the method of producing the semiconductor device according to the embodiment of the present invention.

Next, as shown in FIG. 9A, catalyst plating processing is performed on the surface of the buried metal wiring (13a and 13b) made by Cu. A surface layer portion of the buried metal wiring (13a and 13b) is substituted with a catalyst substance 14.

For example, palladium (Pd) is used as the catalyst substance. As a source of the Pd, palladium sulfate, palladium chloride, etc. are widely used.

Figure 9B:
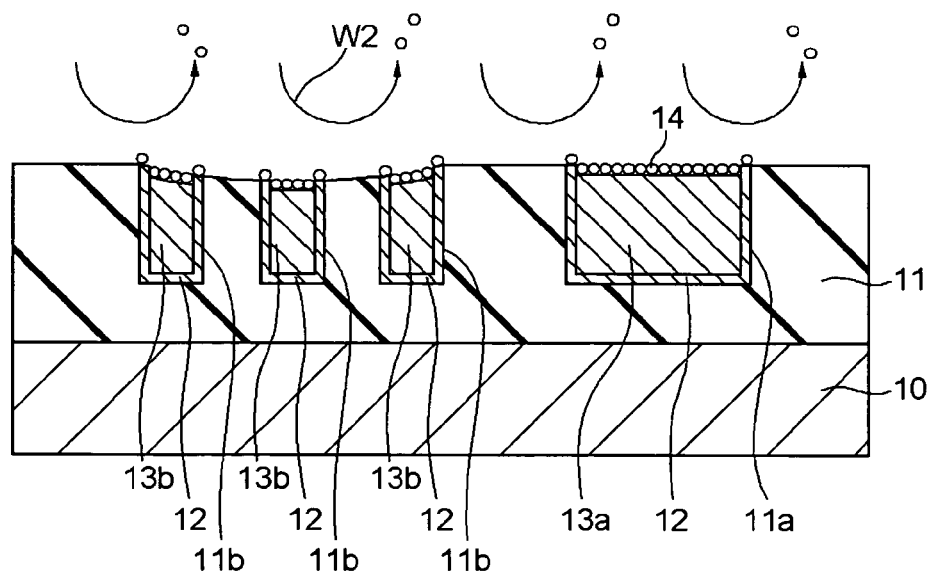

Next, as shown in FIG. 9B, second washing W2 is performed to remove Pd existing on the field.

Pure water is sufficient for the washing, but a chelating agent, etc. may be used to improve the selectivity. Also, it is also effective to use brush washing and ultrasonic wave washing at the same time.

Figure 10A:
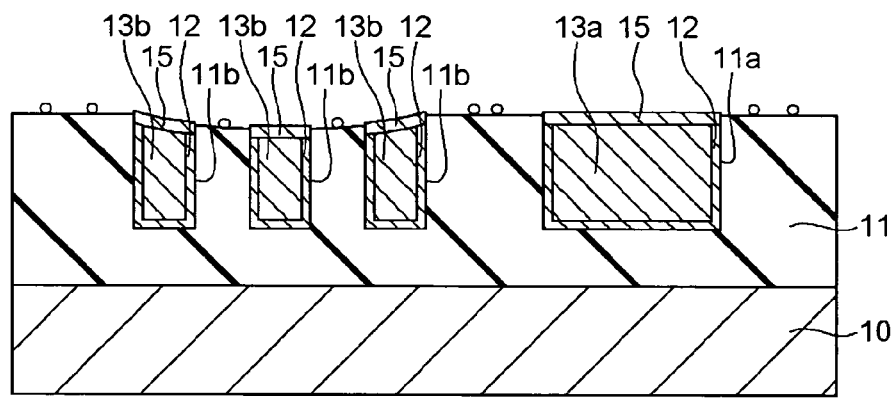
FIG. 10A and FIG. 10B are sectional views of the production processes of the method of producing the semiconductor device according to the embodiment of the present invention.

Next, as shown in FIG. 10A, a second barrier layer 15 made, for example, by Co-W-P is formed by electroless plating processing on the surface of the buried metal wiring (13a and 13b) subjected to substitutional plating with the catalyst substance 14 constituted of Pd. This is the main process in the processes shown in FIG. 8B to FIG. 10B.

A main body of a plating solution is cobalt sulfate (chloride), sodium hypophosphite, sodium citrate (sodium tartrate), ammonium sulfate, sodium tangustate, etc. When sodium as an alkali metal is mixed therein, these chemicals are hard to be applied to a semiconductor device, so that it is preferable to use chemicals wherein sodium as an alkali metal is substituted with ammonia, etc.

Figure 10B:
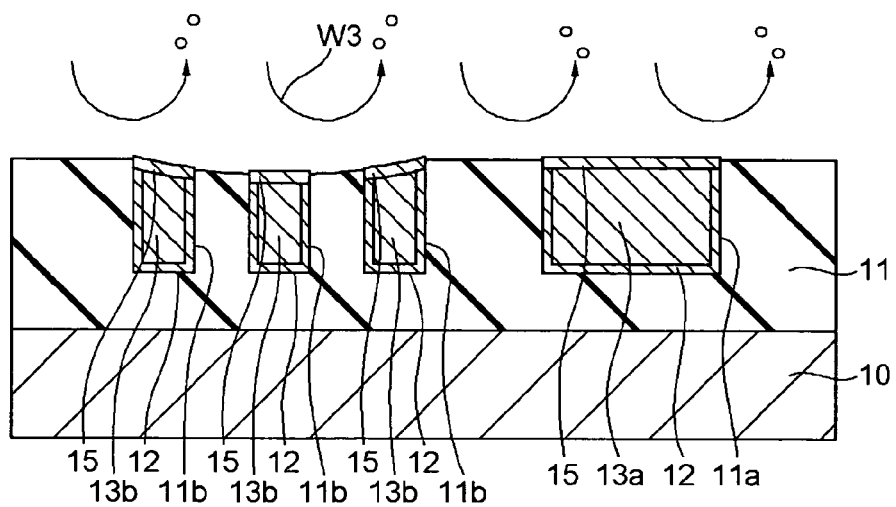

Finally, as shown in FIG. 10B, third washing W3 is performed to remove an electroless plating chemical solution retained on the field.

Pure water washing is sufficient as the third washing W3, but washing by using an alkali chemical solution containing a chelating agent is more effective.

Next, a silicon oxide or other insulation material is deposited allover the second barrier layer 15, for example, by a CVD method to form an upper insulation film 16.

From the above, a semiconductor device wherein buried metal wiring is configured by using Cu shown in FIG. 5 can be produced.

In the method of producing the semiconductor device of the present embodiment, damages by corrosion on the Cu wiring are suppressed at the time of forming the second barrier layer by electroless plating.

It is because the Cu buried wiring contains Ir, Pt, Au or other additive having a less ionization tendency than Pd and has resistance to the catalyst plating solution of Pd. The reason will be explained below.

Where damages by corrosion on the Cu wiring are remarkably exhibited is not a crystal portion of the Cu wiring but a crystal boundary between crystals. Namely, damages by corrosion of the Cu wiring are generated on crystal boundaries of the Cu wiring. It is because oxygen (O), nitrogen (N) and other impurities existing in the Cu film gather on the crystal boundaries, and they are very weakly bonded with Cu and the bond is easily released, so that the crystal boundaries are easily damaged preferentially by corrosion.

Accordingly, it is sufficient if only damages by corrosion are not brought to the crystal boundaries by the Pd catalyst plating solution.

Considering the fact that damages by corrosion of being etched by the Pd catalyst plating solution are caused from the crystal boundaries, in the present embodiment, an additive is introduced as explained above on an object of strengthening the crystal boundaries.

In etching by a Pd catalyst plating solution, two methods are widely used; etching by sulfuric acid or hydrochloric acid and etching by substitution with Pd. Cu is ionized and etched, as $CuSO_4$ or $CuCl_2$ in the etching by sulfuric acid or hydrochloric acid, or because an ionization tendency of Pd is less than that of Cu in the etching by substitution for Pd, while Pd is bonded with etched sites of Cu.

Furthermore, a pitting corrosion phenomenon which is popular in corrosion chemical occurs on crystal boundaries. When corrosion occurs on crystal boundaries, an acid concentration increases at an accelerating pace and the corrosion widely proceeds.

Accordingly, to suppress damages by corrosion on the Cu wiring, it is the most significant that a material hard to be etched is deposited on the crystal boundaries. As to a material hard to be etched, an ionization tendency is the key point as explained above. It can be solved by depositing on the crystal boundaries those having a less ionization tendency than the catalyst substance Pd.

In a process of applying a Co-W-P layer by electroless plating as an upper barrier layer of the Cu wiring, damages by corrosion on the Cu wiring due to Pd catalyst plating are reduced by applying to a wiring portion Cu wiring hard to be damaged by corrosion in the catalyst plating process in the present embodiment, that is, Cu wiring added with a material having a less ionization tendency than Pd.

In the method of producing in the present embodiment, a Co-W-P layer by electroless plating effectively acts as a barrier layer as an upper layer of the Cu wiring of the semiconductor device and a semiconductor device can obtain a large advantage as described below.

(1) Since a Co-W-P layer has diffusion barrier property against Cu, Cu is covered with a metal having a barrier property by forming the Co-W-P layer on the Cu wiring. Therefore, a cap process by an insulation film of SiN, SiC, etc. applied in the Cu wiring process of the related art becomes unnecessary or the film can be made thinner. The dielectric constant of the barrier insulation film of SiN, SiC, etc. is as large as 4 to 7 and substantially raises the effective dielectric constant of an interlayer film, so that by omitting it or making it thinner, the effective dielectric constant of the interlayer film can be reduced. A reduction of the effective dielectric constant leads to a reduction of a wiring capacitance and further to a reduction of a wiring delay, so that a semiconductor device can be made higher at speed.

(2) As one factor of declining reliability of the Cu wiring, there is a disconnection due to electromigration (EM) on a boundary face between Cu and a barrier insulation film. This is because bonding property between the Cu and the insulation film is weak.

As semiconductor devices become finer and higher at speed, a wiring section area decreases, a current density to be applied increases, and along with the increase, joule heating due to a current of wiring tends to increase, so that the EM resistance is more severely required. Furthermore, as to the higher speed, as a result that a clock frequency becomes higher at speed, a current path comes to flow on the surface of the wiring, thus, the EM resistance is furthermore severely required.

In the present embodiment, since the Cu wiring is covered with a metal, a boundary face between Cu and the insulation film which deteriorates the EM resistance does not exist, and the EM resistance is expected to be improved.

Below, a method of mixing Ir, Pt, Au, or other additive having a less ionization tendency than Pd in the Cu buried wiring will be explained below.

Roughly dividing, there are (i) a method of mixing an additive to the Cu seed layer 13s and (ii) a method of mixing an additive in electrolytic plating processing for forming the Cu buried conductive layer 13.

An explanation will be made on the (i) method of mixing an additive to the Cu seed layer 13s.

For forming the Cu seed layer, in the related art, a method of forming the film by sputtering by using pure Cu as a target is widely used, wherein self ionized sputtering (SIS), self ionized plasma (SIP), etc. having preferable coverage even on a fine portion are used as LSIs become finer. Also, when LSIs become furthermore finer, sputtering geographically has a limit in coverage, so that film formation by a CVD method by using hfac (tmvs) or other material is also performed.

(i-1) Method of Mixing Additives in Cu as Target

By mixing an additive to Cu as a target so as to mix the additive to the Cu seed layer 13s, a Cu target mixed with the additive is formed to be a film by a sputtering method and used as the Cu seed layer.

It is required that a mixing amount of the additive to the target is 0.1% or more. The upper limit depends on a specification of a wiring resistance value of the applied device, but is generally 10% or less.

(i-2) Method of Separately Forming Films of Cu and Additives and Stacking the Same Films of Cu and an additive are alternately formed so that the additive is mixed in the Cu seed layer 13s.

In the formed seed layer, Cu layers and additive layers are alternately layered. The number of the layers may be any, but when a thickness of the seed layer film is 100 nm or less and controllability of sputtering of Cu is 10 nm or so, and assuming that a Cu layer and an additive layer is one layer, the maximum number of layers is 10 or so. The ratio of film thicknesses of the Cu layer and the additive layer (Cu layer thickness/additive layer thickness) in one layer is about 10 at maximum and is determined by a wiring resistance specification of the device.

(i-3) Method of Forming Cu Film and Additive Film Separately and Depositing in a State Cu and Additive Exist Together Films of Cu and an additive are separately formed so that the additive is mixed in the Cu seed layer 13s, but they are not in a layer state and formed by a so called co-sputtering method.

The co-sputtering method is a method of forming films of Cu and additive at the same time, wherein the seed layer is not in a layer state and Cu and the additive exist together. A mixing amount of the additive is 0.1% or more. Here, sputtering rate of Cu and the additive has to be carefully controlled. The film thickness is controlled by controlling the sputtering rate, so that the sputtering rate of the additive has to be set 1/1000 (minimum) of that of Cu.

In the case of the seed layer by the CVD method, a film of Cu and a film of the additive are alternately formed for forming a film by stacking in the same way as in the film forming method of (i-2), it can be formed by the same method.

To obtain the same form as in the method of (i-1), it is sufficient to mix an organic gas material including the additive at the time of forming a Cu film by a CVD method.

In the method of (i-3), there are difference in a sputtering pressure and a CVD pressure and difference of a gas system in film forming, so that though it is very difficult, it becomes possible by optimizing the CVD gas pressure and sputtering gas pressure, using Ar as a carrier gas of CVD, and performing sputtering with the Ar.

Next, (ii) a method of mixing an additive in the electrolytic plating processing for forming the Cu buried conductive layer 13 will be explained.

To mix the additive to the Cu buried conductive layer 13, the additive has to be mixed during electrolytic plating film forming. As a mixing method of the additive, the additive is introduced in a form of a main component of an electrolytic plating solution, such as sulfuric acid (additive)$_x$, in the case of a sulfuric acid based compound.

In the case of additives insoluble in the main component of the electrolytic plating solution, there is a method wherein the additive is made to be complex to be mixed in. To obtain complex, a chelating agent for making the additive chelate may be used and, for example, a citric acid based compound, a carboxylic acid based compound, a tartaric acid based compound, a phosphonic acid based compound, etc. may be mentioned.

The adding amount is preferably 0.01% or more and the upper limit depends on a resistance value specification of the applied device but is preferably 10% or less.

From the above, an additive can be mixed in the wiring Cu film.

The above method of mixing an additive may be performed independently or together with other process. For example, a method of mixing an additive to a seed layer in (i-1) may be performed together with the method of mixing by electrolytic plating in (ii). Note that by performing together, the concentration of the additive changes, so that it has to be optimized in consideration with the resistance value specification of the applied device.

The above processes are performed in introduction of an additive to the Cu wiring, but only a poor effect is obtained only by mixing the additive in the Cu wiring. To bring out the effects of the present invention, heat treatment is preferably performed after mixing the additive.

The heat treatment conditions are, for example, a heat treatment temperature of 450° C. or less, a heat treatment time of 1 minute or more, a heat processing atmosphere of vacuum, nitrogen, hydrogen or inert gas, and a heat treatment processing method using a thermal diffusion furnace, a hot plate or rapid thermal annealing (RTA).

Recommended conditions are a heat treatment temperature of 150 to 250° C., a heat processing time of 1 to 2 hours, a heat processing atmosphere of an inert gas or nitrogen gas, and a heat treatment method using a thermal diffusion furnace or a hot plate.

Also, as a technique of furthermore bringing out the effect, there is a rapid cooling method after the heat treatment. The rapid cooling rate is preferably 50° C./second or less.

As an example of the rapid cooling method, water-cooling of a hot plate after heat treatment by the hot plate is finished, nozzle injection of vaporized dry ice ($CO_2$) to a wafer surface after the heat treatment, etc. can be mentioned. Due to the heat treatment and the aftertreatment after the heat treatment, the additive is segregated on the crystal grain boundaries of Cu and an effect of strengthening the crystal grain boundaries against the Pd catalyst plating solution is brought.

A timing of the heat treatment is preferably after forming an electrolytic plating Cu film or after forming a wiring portion by a CMP method or electrolytic polishing.

While the number of processes increases, preferably, processes below are furthermore performed.

(A) A method of, after burying Cu by electrolytic plating shown in FIG. 7B, forming as an upper layer thereof an additive layer or a Cu layer mixed with an additive by a sputtering method, a vapor deposition method, etc. and performing heat treatment.

(B) A method of, after burying Cu by electrolytic plating shown in FIG. 7B, performing ion implantation of an additive by an ion implantation apparatus, then, performing heat treatment.

(C) A method of, after flattening by a CMP method or electrolytic polishing and formation of wiring shown in FIG. 8A, forming as an upper layer thereof an additive layer or a Cu layer mixed with an additive by a sputtering method or a vapor deposition method, performing heat treatment, and finally performing polishing by a CMP method so that the additive and Cu do not retain on the field.

Note that, in this method, a first barrier layer 12 as a base of Cu has to be left without being polished at the time of forming wiring in the process shown in FIG. 8A. It is to prevent diffusion of the additive or Cu mixed with the additive formed as an upper layer.

(D) A method of, after flattening by a CMP method or electrolytic polishing and formation of wiring shown in FIG. 8A, performing ion implantation of an additive by an ion implantation apparatus, performing heat treatment, and finally performing polishing by a CMP method so that the additive and Cu do not retain on the field.

In this method, since additive ions are implanted also on the field, it is necessary to polish to a depth to which the additive ions enter by the CMP method in the final process. Also, a depth and amount of implantation regulated by ion implantation energy and a required film thickness of an interlayer film have to be optimized.

According to a method of producing a semiconductor device and a semiconductor device produced by the production method according to the above present embodiment, effects below can be obtained.

(1) By forming a coverage metal on the Cu wiring, a barrier insulation film of SiN, SiC, etc. having a high dielectric constant required in the related art becomes thin or unnecessary.

(2) Since SiN, SiC, etc. having a high dielectric constant becomes thin or unnecessary, an effective dielectric constant of an interlayer insulation film of a semiconductor reduces and a wiring capacitance also decreases at the same time. Accordingly, an improvement of a wiring speed is expected.

(3) Since SiN, SiC, etc. having a high dielectric constant becomes thin or unnecessary, kinds of stacking layers and the number of stacking layers of the interlayer insulation film of the semiconductor decrease. Therefore, processing of holes and trenches on the interlayer insulation film become easy and a stable processing process can be applied. The stable processing process leads to an improvement of the yield of the semiconductor.

(4) Since bonding of a boundary face between Cu wiring and an insulation film is weak, it becomes an origin of causing electromigration (EM) so as to deteriorate EM resistance. By applying a coverage metal on the Cu wiring, the boundary face between the Cu wiring and the insulation film disappears and an improvement of EM resistance can be expected.

(5) Barrier insulation films of SiN, SiN, etc. have a strong compression stress and cause deterioration of stress migration (SM) and EM resistance. Since these barrier insulation films are thin or unnecessary, an improvement of the SM and EM resistance can be expected.

(6) Since damages by corrosion on the Cu wiring due to a Pd substitution plating solution are reduced, an effective wiring volume is maintained as a layout and a current density at the time of applying a drive voltage is maintained as designed, so that expected wiring reliability can be secured.

(7) Since damages by corrosion on Cu wiring due to the Pd substitution plating solution are reduced, wiring resistance is not raised and a wiring delay time of a design specification can be attained.

(8) Since an attack on a surface on the wiring Cu due to the Pd substitutional plating solution is reduced and a surface morphology of Cu is maintained in a smooth state equivalent to that after a CMP method or electrolytic polishing, EM defective due to boundary face diffusion is reduced.

(9) Since crystal grain boundaries of the Cu wiring are strengthen due to segregation of an additive, grain boundary diffusion as an EM path is suppressed and activated energy of grain boundary diffusion becomes large, so that an improvement of EM resistance and wiring reliability is expected.

The present invention is not limited to the above embodiments.

For example, a barrier insulation film made by silicon nitride, etc. may be formed on the second barrier layer.

For example, in the case where there is not controllability in a lithography process in wiring as an upper layer and formation of connection holes, lithography cannot be performed as a layout due to alignment deviation in the lithography process, fitting deviation is generated and the connection holes are formed outside the wiring portion, etching stops on the wiring portion and proceeds on a field without a barrier insulation film at the time of following process of processing wiring grooves and holes, so that a shape of holes becomes defective. Defective in a hole shape causes defective of burying in a next metal film formation process, and formation of void of the wiring portion and, in extreme cases, breaking of barrier property of Cu arise due to shortage of coverage of a barrier metal, so that a device suffers from a significant damage. However, by providing a barrier insulation film, such disadvantages can be prevented.

Also, it is also effective in the case where there is no controllability in the etching process. It is very difficult to accurately stop etching on the same plane on the wiring portion and field portion in etching processing at the time of alignment deviation, however, this problem can be solved by providing the barrier insulation film.

Also, while an explanation was made on a single damascene method in drawings of the embodiments, a dual damascene method is also possible, namely, it is possible to configure to provide a contact hole reaching to the semiconductor substrate, etc. on the bottom surface of wiring groove, and the wiring groove and the contact hole may be buried with a wiring material.

Other than the above, a variety of modifications may be made within the scope of the present invention.

According to the method of producing a semiconductor device of the present invention, which is a method of producing a semiconductor device having wiring of Cu, etc., damages by corrosion on the wiring in a catalyst process performed at the time of performing electroless plating processing on a Co base material, etc. can be suppressed.

What is claimed is:

1. A method of producing a semiconductor device having metal wiring, comprising steps of:
    forming metal wiring containing an additive on a first insulation film formed in a semiconductor substrate;
    forming on said metal wiring a barrier layer for preventing diffusion of constituting elements of said metal wiring, said step of forming the barrier layer further comprising the step of performing an electroless plating step, said electroless plating step comprising a catalyst plating step and a washing step;
    forming a second insulation film on said barrier layer;
    wherein said additive is an element to reduce corrosion of said metal wiring at the time of forming said barrier layer.

2. A method of producing a semiconductor device as set forth in claim 1, wherein said additive includes an element having less ionization tendency than a catalyst substance to be plated in said catalyst plating process.

3. A method of producing a semiconductor device as set forth in claim 1, wherein:
    the step of forming said metal wiring includes a step of forming a seed layer of the metal wiring and a step of forming the metal wiring integrally with the seed layer; and
    said additive is mixed in said seed layer for the formation.

4. A method of producing a semiconductor device as set forth in claim 1, wherein:
    the step of forming said metal wiring includes a step of forming a seed layer of the metal wiring and a step of forming the metal wiring integrally with the seed layer; and
    said additive is stacked in said seed layer for the formation.

5. A method of producing a semiconductor device as set forth in claim 1, wherein a step of performing heat treatment so that said additive segregates on a grain boundary of said metal wiring is further included after the step of forming said metal wiring.

6. A method of producing a semiconductor device as set forth in claim 1 wherein:
    the step of forming said metal wiring includes a step of forming a seed layer of the metal wiring and a step of forming the metal wiring integrally with the seed layer; and said additive is mixed in said metal wiring in the step of forming the metal wiring integrally with the seed layer.

7. A method of producing a semiconductor device as set forth in claim 2, wherein:

the catalyst substance to be plated in said catalyst plating step is palladium (Pd); and the element having the less ionization tendency than the catalyst substance to be plated in said catalyst plating step contains any one of iridium (Ir), platinum (Pt) and gold (Au).

* * * * *